United States Patent [19]

Goldman et al.

[11] Patent Number: 5,692,187
[45] Date of Patent: Nov. 25, 1997

[54] SHADOW MECHANISM HAVING MASTERBLOCKS FOR A MODIFIABLE OBJECT ORIENTED SYSTEM

[75] Inventors: Phillip Y. Goldman, Mountain View; Andrew J. Hertzfeld, Palo Alto, both of Calif.

[73] Assignee: General Magic, Sunnyvale, Calif.

[21] Appl. No.: 474,278

[22] Filed: Jun. 7, 1995

Related U.S. Application Data

[63] Continuation-in-part of Ser. No. 388,069, Feb. 14, 1995.

[51] Int. Cl.[6] .................................................. G06F 17/30
[52] U.S. Cl. .................................................. 395/619
[58] Field of Search .................................................. 395/619

[56] References Cited

U.S. PATENT DOCUMENTS

| | | | |
|---|---|---|---|
| 4,558,413 | 12/1985 | Schmidt et al. | 395/619 |
| 4,627,019 | 12/1986 | Ng | 395/619 |
| 5,008,816 | 4/1991 | Fogg, Jr. et al. | 364/200 |
| 5,021,983 | 6/1991 | Nguyen et al. | 364/707 |
| 5,022,077 | 6/1991 | Bealkowski et al. | 380/4 |
| 5,133,066 | 7/1992 | Hansen et al. | 395/619 |
| 5,175,849 | 12/1992 | Schneider | 395/619 |
| 5,187,792 | 2/1993 | Dayan et al. | 395/725 |
| 5,202,994 | 4/1993 | Begur et al. | 395/700 |
| 5,287,496 | 2/1994 | Chen et al. | 395/619 |
| 5,301,319 | 4/1994 | Thurman et al. | 395/614 |
| 5,317,731 | 5/1994 | Dias et al. | 395/619 |
| 5,357,629 | 10/1994 | Dinnis et al. | 395/619 |
| 5,457,796 | 10/1995 | Thompson | 395/619 |
| 5,469,555 | 11/1995 | Ghosh et al. | 395/460 |
| 5,475,834 | 12/1995 | Anglin et al. | 395/619 |
| 5,577,244 | 11/1996 | Killebrew et al. | 395/703 |
| 5,590,320 | 12/1996 | Maxey | 395/619 |

OTHER PUBLICATIONS

David A. Patterson and John L. Hennessy, Computer Architecture A Quantitative Approach, ©1990, pp. 432–438.

*Primary Examiner*—Wayne Amsbury
*Attorney, Agent, or Firm*—Skjerven, Morrill, MacPherson, Franklin, & Friel; Stephen A. Terrile

[57] ABSTRACT

A computer system is disclosed which includes a read only memory in which a first version of a data element is stored, a random access memory in which a second version of the data element is stored, and a shadow system for transparently determining whether to access the first or second version of the data element. The system includes a masterblock for accessing the first version of the data element. In the disclosed system, separate areas of memory are maintained for a committed version of the data element and an uncommitted version of the data element. Bottleneck commit routines only allow the uncommitted version to become the committed version of the data element at certain times, such as when the data are not subject to modification. By disposing of the version of the data elements in the uncommitted area, the system effectively reverts to the state it was in at the time changes were last committed from the uncommitted area to the committed area.

13 Claims, 5 Drawing Sheets

SHADOW MECHANISM HAVING MASTERBLOCKS FOR A MODIFIABLE OBJECT ORIENTED SYSTEM

CROSS REFERENCE TO RELATED APPLICATION

This application is a continuation in part of copending, commonly assigned U.S. patent application Ser. No. 08/388,069, filed on Feb. 14, 1995, entitled "Shadow Mechanism For A Modifiable Object Oriented System" and having the Attorney Docket Number M- 2770-U.S., now pending.

BACKGROUND OF THE INVENTION

The present invention relates to computer systems, and, more particularly, to object-oriented computer systems.

Personal computers, originally developed in the 1970's, gave a large population access to computers. The original personal computers were controlled by operating systems such as the CP/M operating system supplied by Digital Research and similar to the Disc Operating System (DOS) supplied by Microsoft. A user interacted with these computers by typing purely verbal predetermined commands into the computer. A user accessed information within the computer system (i.e., navigated through the system) by typing commands which instructed the computer to run software programs, to change directories and to view directories.

In response to these systems and in an attempt to make computer use more intuitive, graphical user interfaces (GUI) operating systems which included personal computer navigation systems were developed. These GUI systems are exemplified by the System 7 operating system which runs on Apple Macintosh computers and by the Microsoft Windows operating environment which runs on IBM compatible personal computers. These GUI systems use navigation systems which include iconic representations of files and programs. These programs also include representations of virtual file systems to metaphorically represent files which are stored in the computer. For example, the Apple Macintosh system uses files inside of folders inside of other folders or disks to represent applications and documents; a user navigates between these folders by clicking on these folders with a cursor positioning device such as a mouse.

Computer systems generally include a number of different kinds of memory. For example, most computer systems today include read only memory (ROM) as well as random access memory (RAM). ROM is non-volatile memory which is relatively inexpensive. ROM is used in a computer system to store system software which is resident when the computer is shut off. RAM is a volatile memory which is more expensive than ROM. RAM is used when code or data needs to be modified because one of the characteristics of RAM is that it is read/writable.

Methods for data buffering in order to write modifications to numerous elements simultaneously are known. These methods are used, for example, in many mass storage systems. In data buffering, modifications are made to the original data stored, for example, on a magnetic disk. The modifications are accumulated in random access memory until the original data on the disk can be modified.

Methods are also known for making copies of original data only when they are needed. One example of such a method is referred to lazy copying. In lazy copying, the fact that a data element is to be copied is recorded. However, the copy is not made until the copied data are needed, such as when those data are to be modified or when the data are to be transmitted through a network. When the copy is needed, the copy is moved to a separate storage device. With lazy copying, once a copy is made, lazy copying does not necessarily maintain an indication that the copy was derived from original data.

Methods are also known for sharing a limited amount of physical memory between many processes. One such method is referred to as virtual memory which divides physical memory into blocks and allocates the blocks to different processes. Whichever process is active actually resides in the random access memory while the other blocks are stored in another form of memory, such as a hard drive. When a different process becomes active, i.e., is requested by a caller, that process is copied into the random access memory and the caller's access to that process is via the random access memory. The copying and accessing of the process from the RAM is transparent to the caller of that process. I.e., the caller does not know where the process is actually stored, merely that the caller wants access to the process.

SUMMARY OF THE INVENTION

It has been discovered that providing a computer system with a read only memory in which a first version of a data element is stored and a random access memory in which a second version of the data element is stored, and a shadow system for determining which version of the data element to access, advantageously provides a computer system which transparently determines which version of the data element to access so that the caller of the data element does not have to know where the version of the data element that the caller wishes to access is stored.

In a preferred embodiment, separate areas of memory are maintained for committed changes to the original data and uncommitted changes to the original data. Bottleneck commit routines only allow the changes made in the uncommitted area into the committed area of data at certain times, such as when the data are not subject to modification. This provides a layer of history to the mechanism. By disposing of all the elements in the uncommitted area, the system effectively reverts to the state it was in at the time changes were last committed from the uncommitted area to the committed area. The invention provides this mechanism in such a way that all client programs, i.e., software running on the computer system, can examine or modify the data without determining the actual location of the data. That is, the bottleneck routines always provide access to the data, whether those data are in their unmodified, source form, or have been subjected to shadowing.

Such a system advantageously provides a computer system which stores a large amount of data in read only memory even though that data is to be modified. Only the elements of data that are in fact modified need to be moved to the modifiable memory such as random access memory. Additionally, such a system maintains an original copy of data independent of modifications made to the data; if the computer system requires the original data, it can be used by ignoring the modifications made to it. Additionally, in a system where modifications to data are temporary, a copy of the original data can be stored in transient memory, the copy can be used to make the modifications to the data and when the modified data are no longer needed, the transient memory can be freed for other purposes. Additionally, for a data element that is eventually modified to be identical to the original element, an optimized shadow system can detect that the modified data element matches the original and discard the modified element from the modified data storage. Additionally, if the transient memory should lose power, be removed from the system, or fail for another reason, the system will remain in a consistent state, and can use the original data to continue operating.

DETAILED DESCRIPTION

The following sets forth a detailed description of the best contemplated mode for carrying out the invention. The description is intended to be illustrative of the invention and should not be taken to be limiting.

Figure 1:
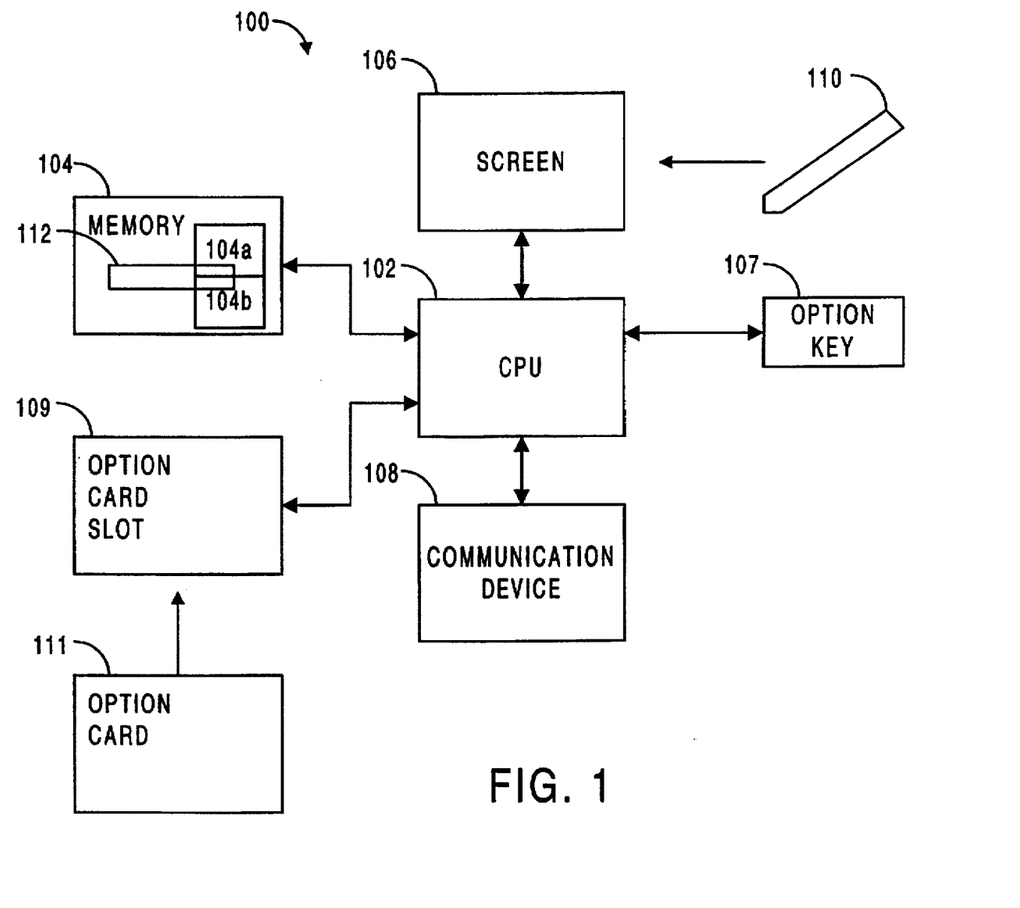
FIG. 1 is a block diagram of a handheld personal computer system which includes a graphical user interface system in accordance with the present invention.

Referring to FIG. 1, personal computer system 100, which functions as a handheld personal communicator, includes central processing unit (CPU) 102 which is coupled to memory 104, display device 106, option key 107, communication device 108 and option card slot 109. Memory 104 includes random access memory 104a and read only memory 104b and also may include other types of nonvolatile memory such as a hard drive.

Display device 106 is, for example, a liquid crystal display (LCD) having 480 columns by 320 rows of pixels, each pixel being capable of displaying one of four levels of grey. Display device 106 is a touch sensitive display device which provides signals to CPU 100 when display device 106 is touched by a touching device such as stylus 110 or a user's finger. The signals include signals indicating the coordinate location of display device 106 where the touch occurred. Accordingly, in addition to functioning as a display device, touch sensitive display device 106 functions as a position locator.

Other position locators which may be used with the present invention include mouse devices, trackball devices, thumbwheels, tablets, scanline sensitive styluses, joysticks and radio-frequency digitizing devices. The term position locator refers include any device which indicates a position on the display screen. Often the position corresponds to the location of a cursor which is displayed on the display screen, however, with touch sensitive devices, the position corresponds to the location that is touched. Often position locators include means for actuating a position on the display device. For example, with touch sensitive devices, the nature of the touch may cause the position to be actuated or for example, mouse devices often include a mouse button, which when pressed, actuates the position which corresponds to the location of the cursor on the display device.

Option key 107 provides signals to CPU 102 indicating when option key 107 is activated. Generally, option key 107 is activated in combination with actuation of a location on display device 106. Option card slot 109 is configured to receive an option card such as memory card 111.

Memory 104 stores Magic Cap™ system software 112 which controls the operation of system 100. System software 112 is stored within RAM 104a and ROM 104b and as well as within other parts of memory 104 such as a hard drive. System software 112 includes groups of instructions which are organized as objects. During operation of system 100, CPU 102 retrieves the objects from memory 104 and executes the objects 104 to perform tasks. Computer system software 112 includes a shadow system which allows computer system 110 to optimize the use of RAM 104a.

Computer system software 112 is implemented using an object oriented framework. An object oriented framework uses object oriented concepts such as class hierarchies, object states and object behavior. These concepts, which are briefly discussed below, are well known in the art. Additionally, an object oriented framework may be written using object oriented programming languages, such as the C++ programming language, which are well-known in the art, or may be written, as is the case with the preferred embodiment, using a non-object programming language such as C and implementing an object oriented framework in that language.

The most basic building block of an object oriented framework is an object. An object is defined by a state and a behavior. The state of an object is set forth by fields of the object. The behavior of an object is set forth by methods of the object. Each object is an instance of a class, which provides a template for the object. A class defines zero or more fields and zero or more methods.

Fields are data structures which contain information defining a portion of the state of an object. Objects which are instances of the same class have the same fields. However, the particular information contained within the fields of the objects can vary from object to object. Each field can contain information that is direct, such as an integer value, or indirect, such as a reference to another object.

A method is a collection of computer instructions which can be executed in CPU 102 by computer system software 112. The instructions of a method are executed, i.e., the method is performed, when software 112 requests that the object for which the method is defined perform the method. A method can be performed by any object that is a member of the class that includes the method. The particular object performing the method is the responder or the responding object. When performing the method, the responder consumes one or more arguments, i.e., input data, and produces zero or one result, i.e., an object returned as output data. The methods for a particular object define the behavior of that object.

Classes of an object oriented framework are organized in a class hierarchy. In a class hierarchy, a class inherits the fields and methods which are defined by the superclasses of that class. Additionally, the fields and methods defined by a class are inherited by any subclasses of the class. I.e., an instance of a subclass includes the fields defined by the superclass and can perform the methods defined by the superclass. Accordingly, when a method of an object is called, the method that is accessed may be defined in the class of which the object is a member or in any one of the superclasses of the class of which the object is a member. When a method of an object is called, computer system 100 selects the method to run by examining the class of the object and, if necessary, any superclasses of the object.

A subclass may override (i.e., supersede) a method definition which is inherited from a superclass to enhance or change the behavior of the subclass. However, a subclass may not supersede the signature of the method. The signature of a method includes the method's identifier, the number and type of arguments, whether a result is returned, and, if so, the type of the result. The subclass supersedes an inherited method definition by redefining the computer instructions which are carried out in performance of the method.

Classes which are capable of having instances are concrete classes. Classes which cannot have instances are abstract classes. Abstract classes may define fields and methods which are inherited by subclasses of the abstract classes. The subclasses of an abstract class may be other abstract classes.

All classes defined in the disclosed preferred embodiment, except for mix-in classes which are described below, are subclasses of a class, Object. Thus, each class that is described herein and which is not a mix-in class inherits the methods and fields of class Object.

Figure 2:
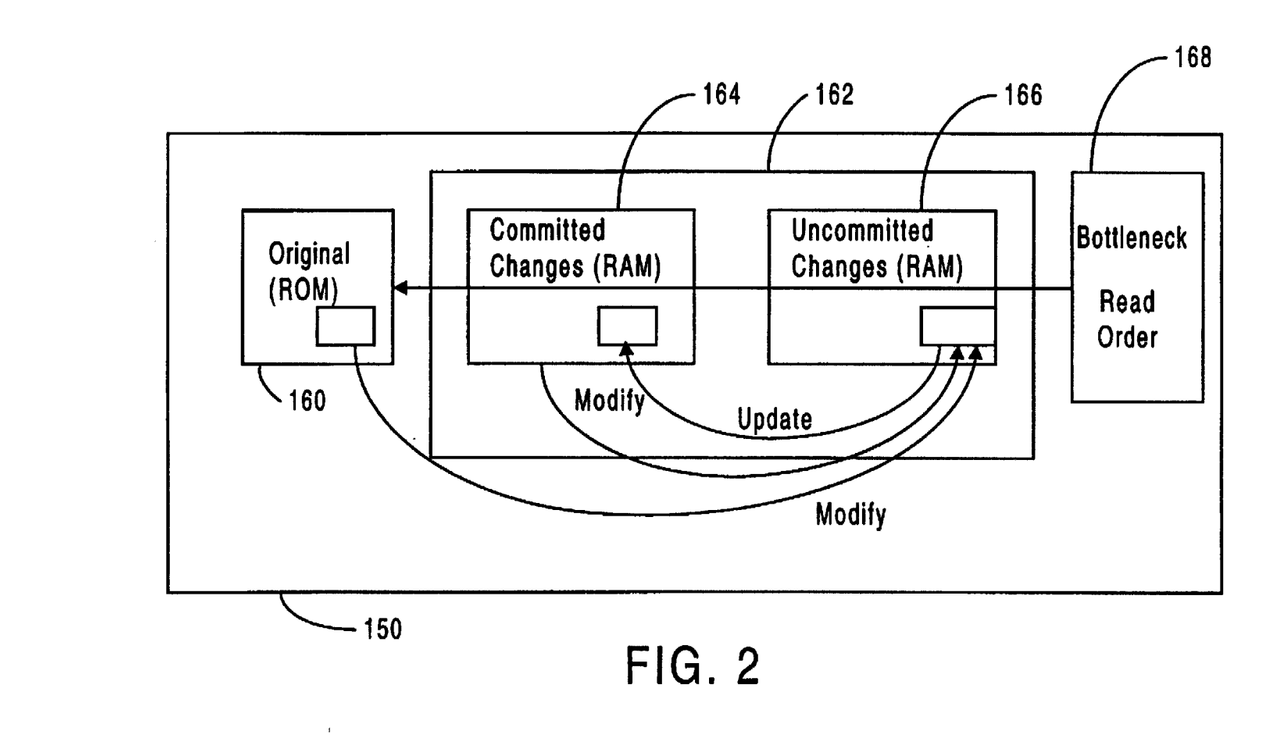
FIG. 2 is a block diagram of a shadow mechanism of the FIG. 1 computer system in accordance with the present invention.

Referring to FIG. 2, computer system software 112 includes shadow system 150. Shadow system 150 provides computer system software 112 with a shadowing function. Shadow system 150 divides memory 104 into a plurality of spaces with which shadow system 150 interacts. More specifically, shadow system interacts with original data space 160, which in the preferred embodiment is within ROM 104b and modified data storage space 162, which in the preferred embodiment is within RAM 104b. Modified data storage space 162 further includes uncommitted change space 164 and committed change space 166. Original data space 160 provides a constant memory in which data is not modified and Modified data storage space 162 provides a modifiable memory in which data may be modified.

When computer system 100 modifies an element of data which is originally stored in original space 160, shadow system 150 copies data from original data storage space 160 to modified data storage space 162. Next computer system 100 modifies the data element so that the data element which is stored in modified data storage space 162 corresponds to the modification. All subsequent references to the data element are made through bottleneck routines 168 that first search for the data element in modified data storage space 162. If the element is found in modified data storage space 162, then it is used. If the element is not found in modified data storage space 162, the bottleneck routine then searches for the data element in original data storage space 160.

The bottleneck routines are the only data modification routines which access the actual data elements. Even if a high level portion of the software wishes to access a data element, the higher level portion of software calls a bottleneck routine, which in turn accesses the data element. In this way, data element accesses all pass through a small number of routines when accessing data, i.e., a bottleneck. The bottleneck routines which are used by shadowing system 150 include the methods Begin Modify, Set Field and Write Fields. These methods provide a bottleneck function as they provide a small, well defined bottleneck through which all modifications of objects by methods of system 112 must pass.

More specifically, the method Begin Modify begins to make changes to the data fields of an object. After the method Begin Modify is called and before the method End Modify is called, a pointer and offsets may be used to refer to and to modify the fields of the object. That is, the object is locked in place between the invocation of the methods Begin Modify and End Modify. The method Set Field makes a change to a single data field of an object. The method Set Field differs from the method Begin Modify by being a single operation that does not leave the object locked in place or require a corresponding end operation such as the method End Modify. The method Write Fields makes changes to a set of data fields of an object. The method Write Fields differs from the method Begin Modify by being a single operation that does not leave the object locked in place or require a corresponding end operation.

Many methods use the bottleneck methods without calling them directly, by calling other routines that call one or more of the bottleneck methods. More specifically, any routine whose operation results in the modification of an object must, at some level, result in the calling of one of the bottleneck routines. For example, the high level method Set Color changes the color field of an object that has the color field by calling Set Field with the field number of the color field and the new value for the color field. Thus, the routine calling Set Color indirectly effects the execution of Set Field, one of the bottleneck methods, to perform the modification of the object.

Because modified data storage space 162 includes uncommitted change space 164 and committed change space 166, the shadowing function may include information which is stored within both of these spaces. I.e., the combination of a committed shadow (information which is stored within committed change space 164) and an uncommitted shadow (information which is stored within uncommitted change space 166) provide a complete shadowing function.

Additionally, the use of both committed data space 164 and an uncommitted data space 166 within the modified space provides the ability of checkpointing changes to memory. Checkpointing provides periodic backups, to which the system can revert should the working copy become somehow corrupted or damaged. Objects that have been modified and put into the shadow cluster by the bottleneck routines are put into the uncommitted shadow cluster. The modifications remain in the uncommitted shadow cluster until the system performs a call to the method Update.

The method Update moves the changed object from the uncommitted shadow cluster to the committed shadow cluster. When the objects are moved from the uncommitted shadow cluster to the committed shadow cluster, the objects are deleted from the uncommitted shadow cluster.

If it is necessary to eliminate an existing set of changes, as for example, when an inconsistency is found within the objects in the uncommitted changes cluster, all that is necessary is to discard the entire uncommitted changes cluster. Because changes to objects have been periodically checkpointed by moving them into the committed shadow cluster, discarding the uncommitted changes has the effect of returning the system to the state that it was in the last time the system called the method Update.

As a platform for software applications, system 112 provides access to data by the client software applications through a well-defined set of bottleneck routines. The performance of shadowing is transparent to the client applications. That is, the client applications use the same routines to examine or modify data, whether the data are currently shadowed or not.

Figure 3:
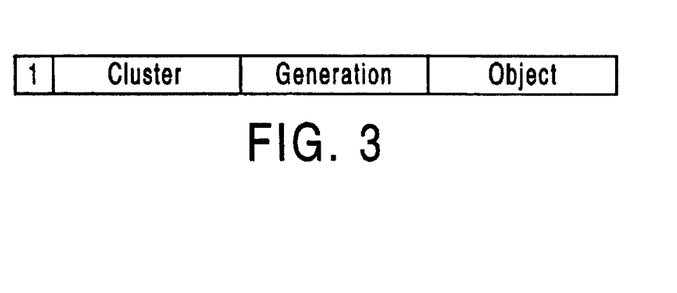
FIG. 3 is a block diagram of an object identifier for an object which is used by the shadow system in accordance with the present invention.

Referring to FIG. 3, objects are referred to by object identifiers. These identifiers are 32-bits wide and are divided into four parts. The top bit, which indicates whether this information is an object identifier, is always set in an object identifier.

The next lower four bits represent the cluster identifier and indicate the cluster in which the object is located. A cluster is a coherent set of objects. For example, in the preferred embodiment there are a ROM source cluster, a committed changes cluster and an uncommitted changes cluster corresponding to the original data space, the committed change space and the uncommitted change space, respectively. Each version of an object is in exactly one cluster and each cluster contains no more than one version of an object. Associated with a cluster is at least one masterblock, which provides a mapping from the object numbers of the objects within that cluster to the location of each of the objects.

The lowest bits are the object number and identify the object within a cluster. The bits between the cluster identifier and the object identifier are the generation bits. The generation bits are cycled as object numbers are assigned, allowing object numbers to be reused with different generation bits denoting different objects for the same object number. The number of bits used for each of the generation bits and the object number is determined by the context of the cluster.

If at any time, the object identifier's generation number is found not to match the masterblocks entry's generation number or the generation number stored as part of the object itself, the operation to look up the object fails. Thus, the generation number allows for object numbers to be re-used, as when one object has been deleted and a new object is created, while minimizing the risk that an object stored in the field of another object will refer to a new object rather than the object to which it is supposed to refer.

When a bottleneck method is called on an object, system 112 examines the cluster number of the object's object identifier. The system uses this cluster number to determine which cluster masterblock, i.e., list of pointers, to access. Once the cluster is identified, the object number is used to look up the starting position, i.e., the starting address, of the object within the cluster masterblock.

Figure 4:
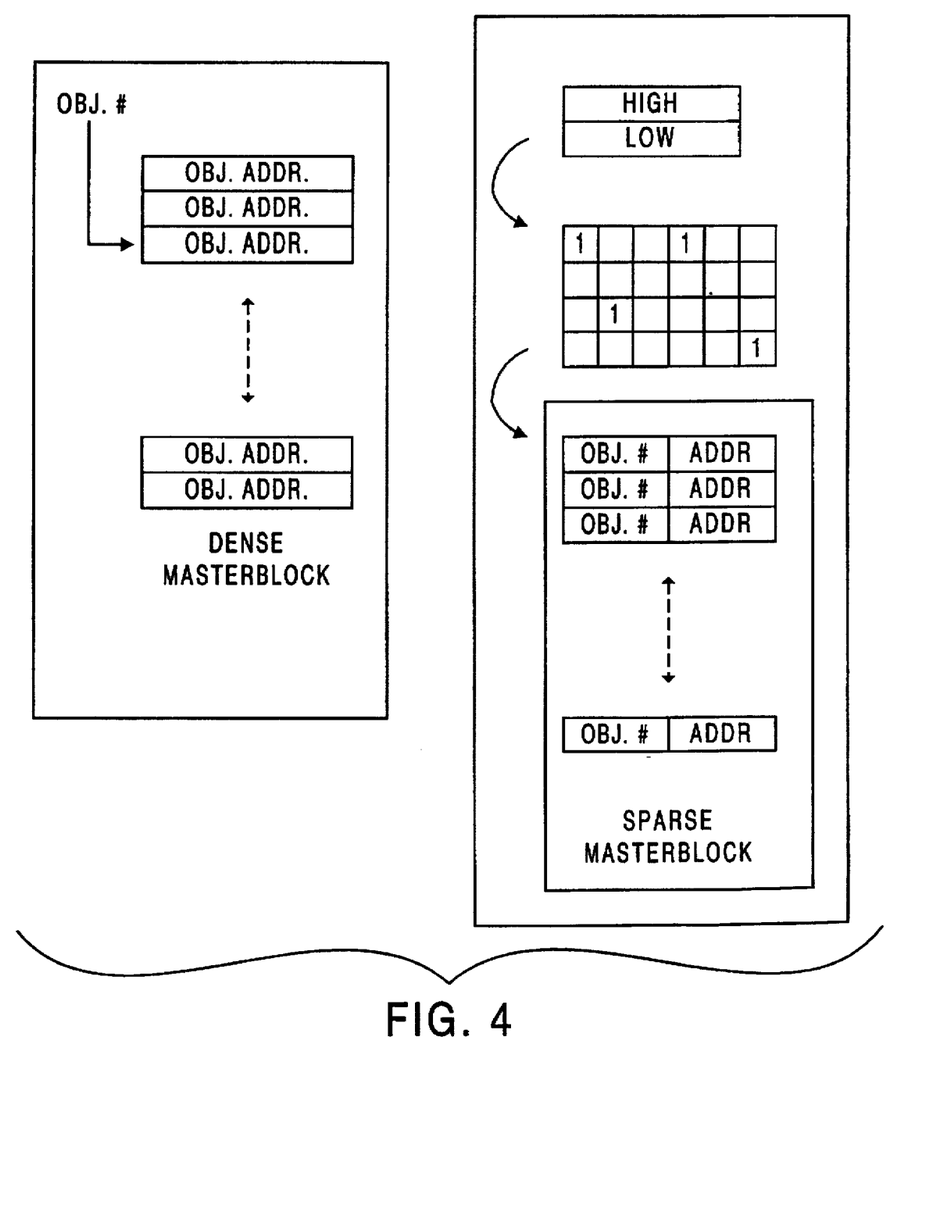
FIG. 4 is a block diagram of clusters for accessing objects in accordance with the present invention.

More specifically, referring to FIG. 4, in the basic case, system 112 includes a dense masterblock. A dense masterblock is used for example to index the source cluster. The dense masterblock is a list of address offsets. The list starts at an address identified as a cluster pointer. The object number is used as an index into the masterblock list and the offset is added to the cluster pointer to obtain the address of the beginning of the object. The use of offsets rather than hard addresses allows the cluster to be relocated in memory without updating the data inside it merely by changing the cluster pointer. Offsets are valid from any starting address, even after that address changes.

System 112 may also include a sparse masterblock. A sparse masterblock may be used for example, to index the uncommitted changes cluster. A sparse masterblock is a sorted list of pairs, each pair consisting of an object identifier and the offset of that object's location from the beginning of the cluster. To obtain the address of an object from a sparse masterblock, the system performs a binary search for the Object number within the sparse masterblock. The sparse masterblock is a sorted table relating object numbers to object offsets. Sparse masterblocks enable existing objects to be shadowed without requiring that the shadow cluster's masterblock equal the source cluster's masterblock in size. In the preferred embodiment, all shadow clusters contain a sparse master block and a dense masterblock. The former is for changes to objects in the source cluster and the latter is for new objects that are created anew and never existed in the source cluster.

System 112 provides the additional feature of the ability for a cluster to refer to another cluster as its source cluster. If the object number is not found in the cluster referred to by the cluster number in the object identifier, then the system searches for the object number in that cluster's source cluster. This feature allows for any number of shadow clusters, as a shadow cluster can refer to another cluster as its source, and that source cluster can refer to another cluster as its source. This feature allows for multiple levels of reverting, since the shadow clusters can be stripped away one by one.

As an optimization, each sparse masterblock maintains a bit table of the objects referenced by the list of the sparse master block, thus providing a quick rejection feature. This bit table contains one bit per possible object number. When an object number is searched in the sparse masterblock, system 112 uses the object number as an index into the bit table. If the bit accessed by the object number is set, the object is in the sparse masterblock, and thus part of the cluster to which the sparse masterblock provides access. If the object number bit is clear, then the object is not in the sparse masterblock, and thus not part of the cluster to which the sparse masterblock provides access. Thus, before performing a binary search for an object number within the masterblock, the system can determine whether the sparse masterblock contains the index to the object number.

To maintain this optimization, the bit which is set when an object is added to the cluster must be cleared when the object is removed from the cluster. For example, when an object is shadowed by copying the object into a shadow cluster, the bit for that object number is set in the bit table. When an object is removed from the shadow cluster, the bit for that object number is cleared.

As an optimization, system 100 provides an access cache within memory 104 which is used by shadow system 150. When shadow system 150 performs a search, the object identifier is checked against object identifier values which are stored within the access cache. These object identifier values map object identifiers to pointers. If the object identifier matches a value which is stored within the access cache, the pointer to the start of the object is returned by the access cache.

Additionally, as an optimization, system 100 tracks the lowest and highest object numbers contained in a particular sparse masterblock. Before doing any other check to determine if an object is referenced in a sparse masterblock, the candidate object number is compared to these lowest and highest numbers. If the candidate object number is not within the range, the object is not referred to within the masterblock and no further search within the masterblock is necessary.

The bottleneck routines Begin Modify, Set Field and Write Fields will now be discussed in more detail.

Figure 5:
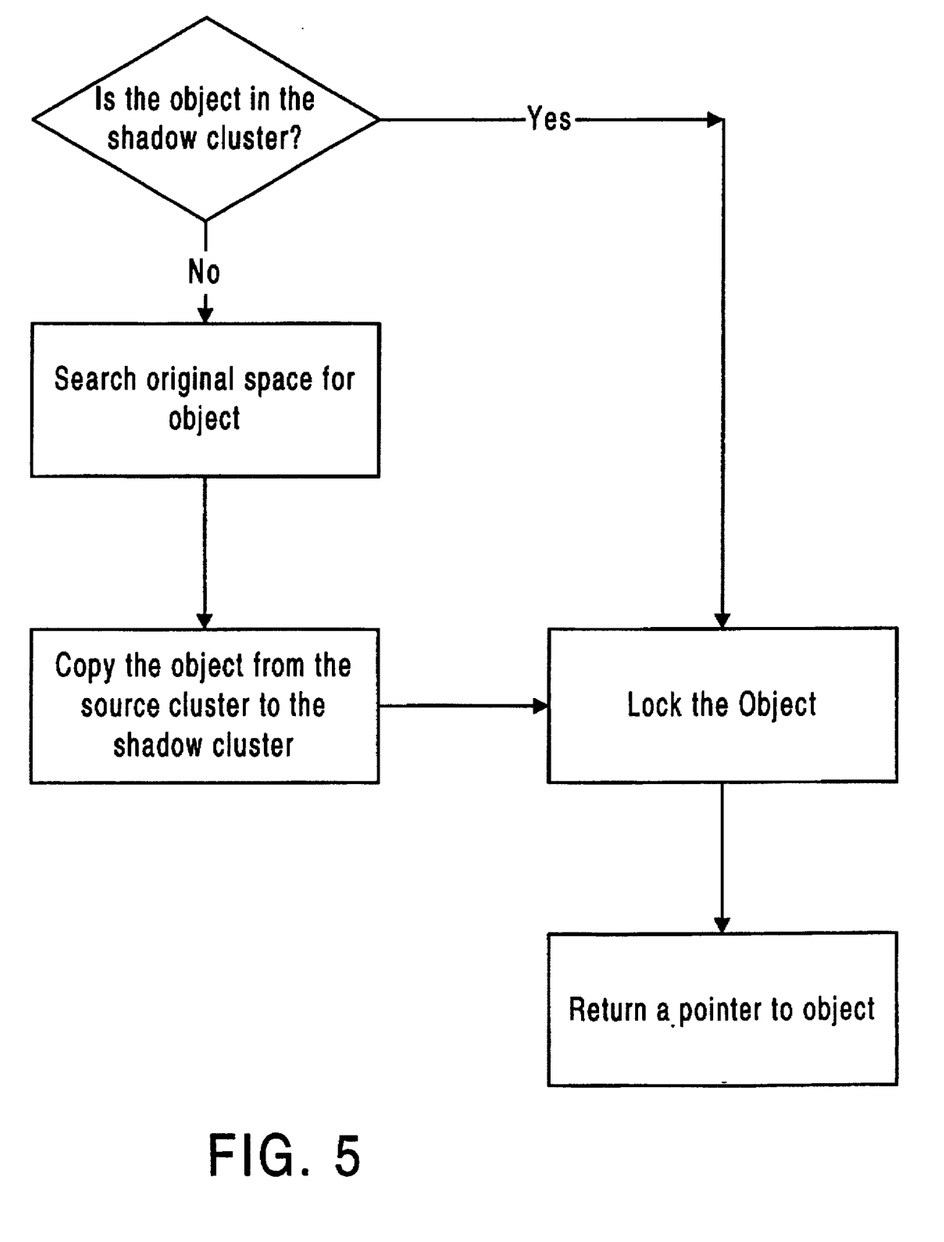
FIG. 5 is a flow chart of a Begin Modify method of the shadow system in accordance with the present invention.

More specifically, referring to FIG. 5, when the method Begin Modify is called on an object, Begin Modify searches first in a shadow cluster within modified data storage space 162 for the object. If the object is found in the shadow cluster, Begin Modify locks the object so that its location in memory does not change while the object is being modified. Begin Modify then returns a pointer to the object's location in memory. The method that called Begin Modify (the calling method) then uses the pointer to manipulate the correct addresses (i.e., the addresses which correspond to the different fields of the object) in memory and thereby make changes to the object.

If the object is not found in a shadow cluster within modified data storage space 162, Begin Modify then searches an object source cluster within original data storage space 160 to find the object. Once the object is located, an identical copy of the object is made in a shadow cluster within modified data storage space 162. Next, Begin Modify locks the copied object so that its position in memory does not change while the object is being modified. Begin Modify then returns a pointer to the object's location in memory within the shadow cluster. The calling method then uses that pointer to manipulate the correct addresses in memory and thereby make changes to the object.

Begin Modify gives access to the fields of an object. In the preferred embodiment, these fields are defined statically upon definition of the class to which the object belongs. The size of each of the fields is included as part of the static object definition. However, because Begin Modify returns a pointer, the invention is not restricted to systems in which object fields are statically defined and objects are assigned to classes at instantiation.

Following the modification of an object, the modifying method, i.e., the method that called Begin Modify, calls End Modify. End Modify unlocks the object in memory.

Figure 6:
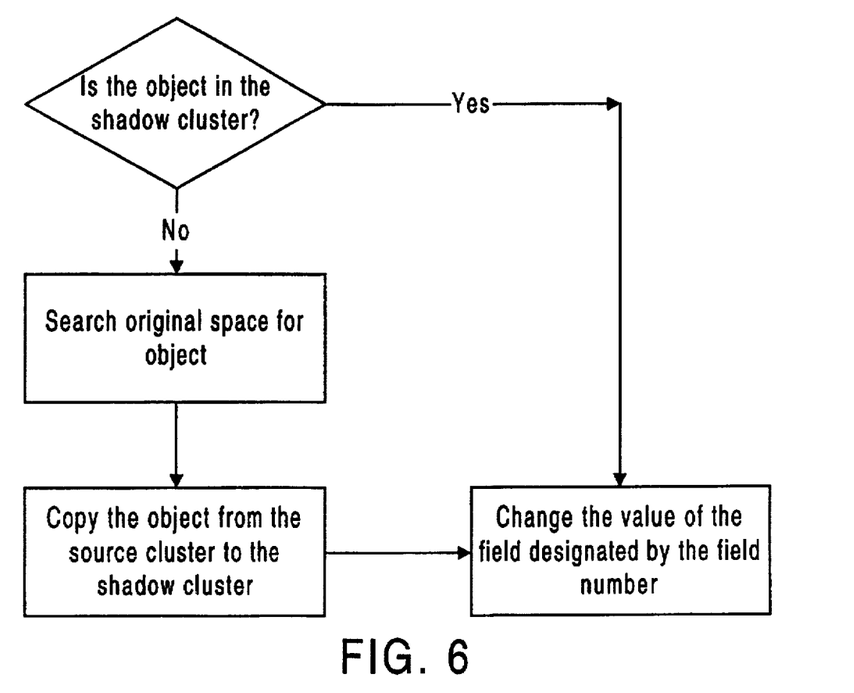
FIG. 6 is a flow chart of a Set Field method of the shadow system in accordance with the present invention.

Referring to FIG. 6, the method Set Field provides a direct method for changing a single field in an object. The method Set Field takes as an argument the number of the field to be modified. As is well known in the art, the number of a field is established when the class of the object is defined. Set Field also takes as an argument the new value that the field is to have.

The method Set Field first searches a shadow cluster within modified data storage space 162 for the object. If the object is found there, the method Set Field uses the field number to index to the correct address within the object. The memory location corresponding to this address is set to the new value.

If the method Set Field does not find the object in the shadow cluster, Set Field searches for the object in the original cluster within original data storage space 160. Once the object is found, a copy of the object is made in the shadow cluster in modified data storage space 162. Set Field then proceeds exactly as it would had it found the object in the shadow cluster. Set Field uses the field number to index to the correct address within the object in the shadow cluster. The memory at this address is set to the new value.

As an optimization, when the method Set Field finds the object in the source cluster, Set Field checks the existing value of the field identified by the field number which is passed. If this value is identical to the new value passed in as an argument, the object is left in the source cluster and Set Field returns immediately. No copying is needed as the object already has the value to which the field was to be set.

Figure 7:
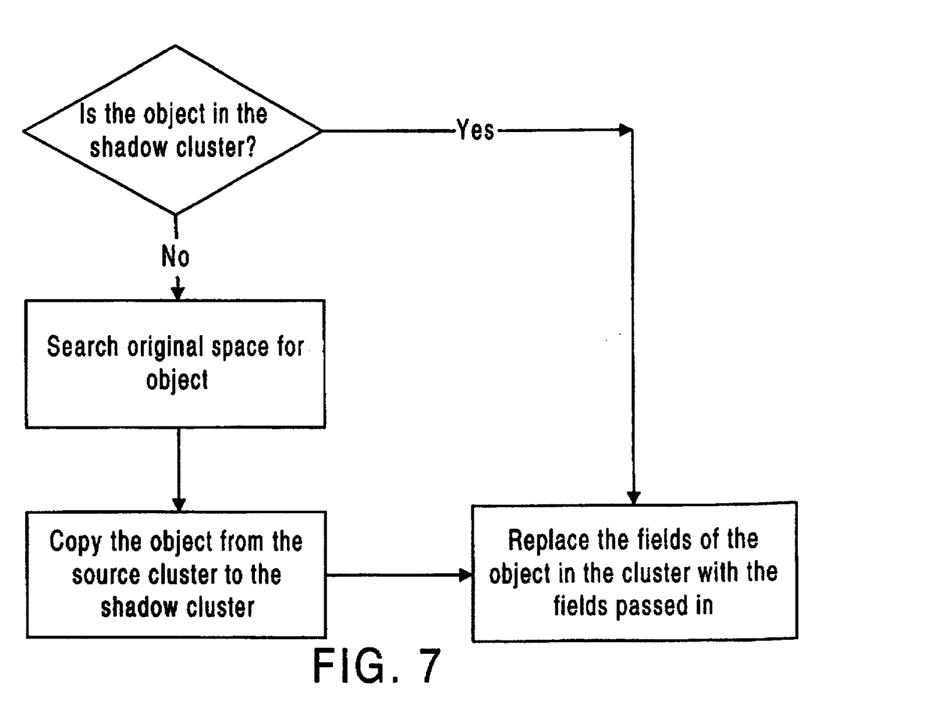
FIG. 7 is a flow chart of a Write Fields method of the shadow system in accordance with the present invention.

Referring to FIG. 7, the method Write Fields provides a one-step technique for changing the value of more than one field in an object without locking the object, as the method Begin Modify does. The method Write Fields operates like the method Set Field does. More specifically, the method Write Fields takes as an argument a pointer to a structure that contains the new values to which the fields of the object should be set. The method Write Fields first searches in a shadow cluster within modified data space 162 for the object. If the object is found there, the method Write Fields replaces the existing values stored in the object's fields with the values contained in the structure passed to the method Write Fields. If the method Write Fields does not find the object in the shadow cluster, the method searches for the object in an original cluster within original data space 160. Once the object is found there, a copy of the object is made in the shadow cluster. The values in the fields of the newly copied object are copied from the structure which is passed in to the method Write Fields.

OTHER EMBODIMENTS

Other embodiments are within the following claims.

For example, because computer system 100 allows the simultaneous existence of committed and uncommitted shadow clusters, a single source cluster may support multiple shadow clusters. This allows multiple alterations of a base system while using only enough memory to store the difference of each alteration from the source cluster of the base system.

This technique is used, for example, to checkpoint the state of the software system. A shadow cluster represents the state of the software system at the time of the last modification to the shadow cluster. If, due to data corruption or comparable circumstances, the computer system needs to be put into the same state as when it was last checkpointed, all shadow clusters that postdate the chosen shadow cluster are destroyed.

What is claimed is:

1. An information handling system comprising
    a processor,
    a read only memory coupled to the processor, the read only memory storing a first version of a data element, the first version of the data element including a plurality of objects,
    a random access memory coupled to the processor, the random access memory storing a second version of the data element, the second version of the data element including a plurality of objects, and
    a shadow system, the shadow system transparently determining which of the first and second versions of the data elements the processor accesses, the shadow system including a masterblock for accessing objects of the first version of the data element, the masterblock including a list of address offsets, and the list of address offsets starting at a cluster pointer address.

2. An information handling system comprising
    a processor,
    a read only memory coupled to the processor, the read only memory storing a first version of a data element, the first version of the data element including a plurality of objects,
    a random access memory coupled to the processor, the random access memory storing a second version of the data element, the second version of the data element including a plurality of objects, and
    a shadow system, the shadow system transparently determining which of the first and second versions of the data elements the processor accesses, the shadowy system including a plurality of masterblocks, each masterblock for accessing objects of the first version of the data element, the plurality of masterblocks being accessed via a masterblock list of cluster pointer addresses, each masterblock including a list of address offsets, the list of address offsets starting at a cluster pointer address, and wherein an object number provides an index to the cluster pointer address.

3. The information handling system of claim 2 wherein the list of address offsets is added to the cluster pointer to access an object within the first version of data elements.

4. An information handling system comprising a processor, a read only memory coupled to the processor, the read only memory storing a first version of a data element, the first version of the data element including a plurality of objects, a random access memory coupled to the processor, the random access memory storing a second version of the data element, the second version of the data element including a plurality of objects, and a shadow system, the shadow system transparently determining which of the first and second versions of the data elements the processor accesses, the shadow system including a first masterblock for accessing objects of the first version of the data element, and a second masterblock for accessing objects within the second version of data elements, wherein the second version of the data element has a beginning location, and the second masterblock includes a list of pairs, each pair including an object identifier and an offset of a location of the object from the beginning location of the second version of the data element.

5. The information handling system of claim 4 wherein the list of pairs is sorted by the object identifier of each pair.

6. The information handling system of claim 4 wherein the second masterblock includes a bit table of objects referenced by the list of pairs, the bit table including a bit per possible object number.

7. The information handling system of claim 4 wherein the second masterblock includes storage locations for storing lowest and highest object numbers, the lowest and highest object numbers indicating the lowest and highest object numbers of objects referenced by the second masterblock.

8. An information handling system comprising a processor, a read only memory coupled to the processor, the read only memory storing a first version of a data element, the first version of the data element including a plurality of objects, a random access memory coupled to the processor, the random access memory storing a second version of the data element, the second version of the data element including a plurality of objects, and a shadow system, the shadow system transparently determining which of the first and second versions of the data elements the processor accesses, the shadow system including a dense masterblock for accessing objects of the first version of the data element, and a sparse masterblock for accessing objects within the second version of data elements, wherein the dense masterblock includes a list of address offsets, and the list of address offsets starts at a cluster pointer address.

9. The information handling system of claim 8 wherein the list of address offsets is added to the cluster pointer to access an object within the first version of data elements.

10. An information handling system comprising a processor, a read only memory coupled to the processor, the read only memory storing a first version of a data element, the first version of the data element including a plurality of objects, a random access memory coupled to the processor, the random access memory storing a second version of the data element, the second version of the data element including a plurality of objects, and a shadow system, the shadow system transparently determining which of the first and second versions of the data elements the processor accesses, the shadow system including a dense masterblock for accessing objects of the first version of the data element, and a sparse masterblock for accessing objects within the second version of data elements, wherein the second version of data elements has a beginning location, and the sparse masterblock includes a list of pairs, each pair including an object identifier and an offset of a location of the object from the beginning location of the second version of data elements.

11. The information handling system of claim 10 wherein the list of pairs is sorted by the object identifier of each pair.

12. The information handling system of claim 10 wherein the sparse masterblock includes a bit table of objects referenced by the list of pairs, the bit table including a bit per possible object number.

13. The information handling system of claim 10 wherein the sparse masterblock includes storage locations for storing lowest and highest object numbers, the lowest and highest object numbers indicating the lowest and highest object numbers of objects referenced by the sparse masterblock.

* * * * *